(12) United States Patent
Piesinger

(10) Patent No.: US 6,667,610 B2
(45) Date of Patent: Dec. 23, 2003

(54) APPARATUS AND METHOD FOR IDENTIFYING CABLE PHASE IN A THREE-PHASE POWER DISTRIBUTION NETWORK

(76) Inventor: Gregory Hubert Piesinger, 6225 E. Saguaro Vista Ct., Cave Creek, AZ (US) 85331

( * ) Notice: Subject to any disclaimer, the term of this patent is extended or adjusted under 35 U.S.C. 154(b) by 0 days.

(21) Appl. No.: 10/317,910

(22) Filed: Dec. 12, 2002

(65) Prior Publication Data

US 2003/0169029 A1 Sep. 11, 2003

Related U.S. Application Data

(60) Provisional application No. 60/363,076, filed on Mar. 11, 2002.

(51) Int. Cl.[7] .......................... G01R 19/00; G01R 25/00
(52) U.S. Cl. ............................................. 324/66; 324/86
(58) Field of Search ................................ 324/66, 76.77, 324/76.52, 76.53, 86, 107, 103 R

(56) References Cited

U.S. PATENT DOCUMENTS

| | | |
|---|---|---|
| 4,626,622 A | 12/1986 | Bouvrette |
| 5,510,700 A | 4/1996 | Pomatto |
| 5,521,491 A * | 5/1996 | Najam .......................... 324/86 |
| 6,130,531 A | 10/2000 | Hao |

OTHER PUBLICATIONS

Satellite Phasing Unit FC4000 User's manual. ndb Technologie Inc., Feb. 4, 2001.

* cited by examiner

Primary Examiner—John E. Chapman
Assistant Examiner—James C. Kerveros

(57) ABSTRACT

A cable phase identification system and method identifies the phase of a power cable at a remote location in a three-phase power distribution network. The instantaneous phase at a known phase location is measured and saved each GPS second using the 1 pps time mark of a GPS receiver. The instantaneous phase at an unknown phase location is measured at a single GPS second using the 1 pps time mark of its GPS receiver and compared to the phase measurement taken at the known phase location at the same GPS second. The differential phase between these simultaneously taken known and unknown cable instantaneous phase measurements will be close to either 0, +120, or −120 degrees, thus identifying the cable phase at the unknown phase location.

23 Claims, 5 Drawing Sheets

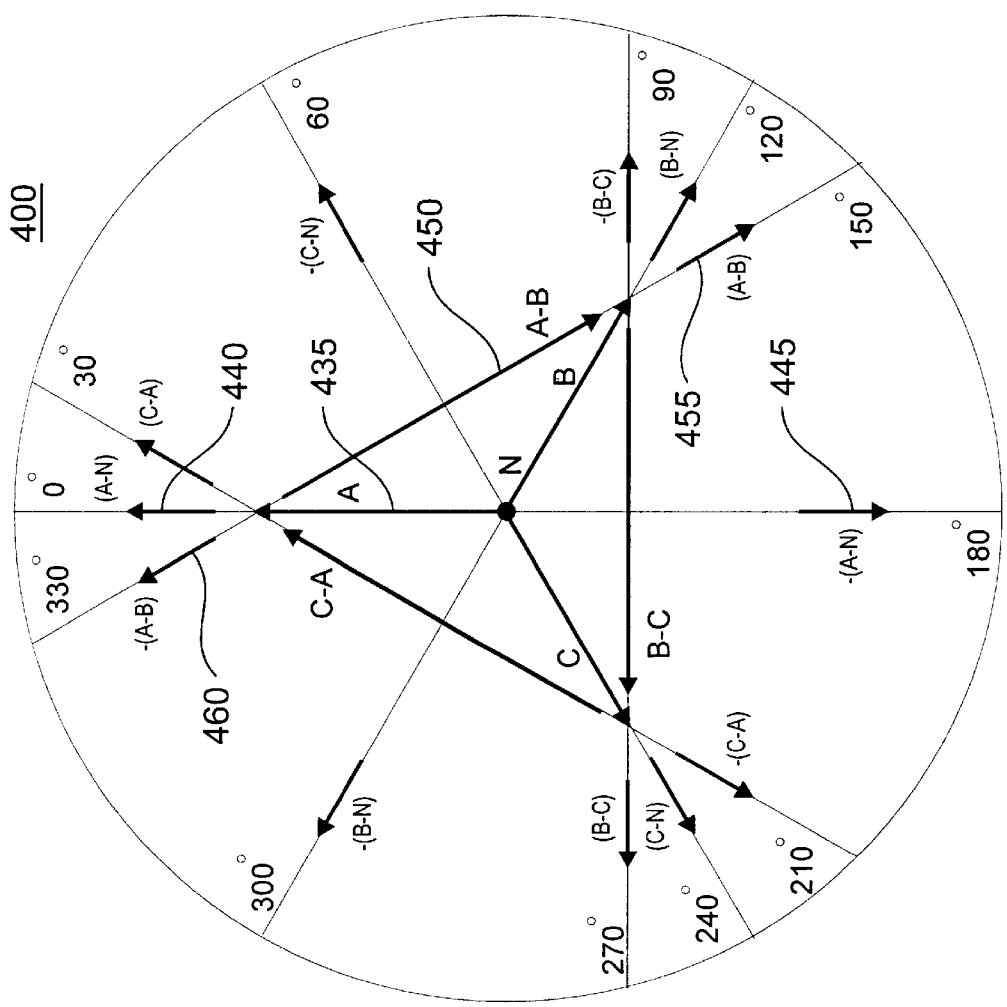
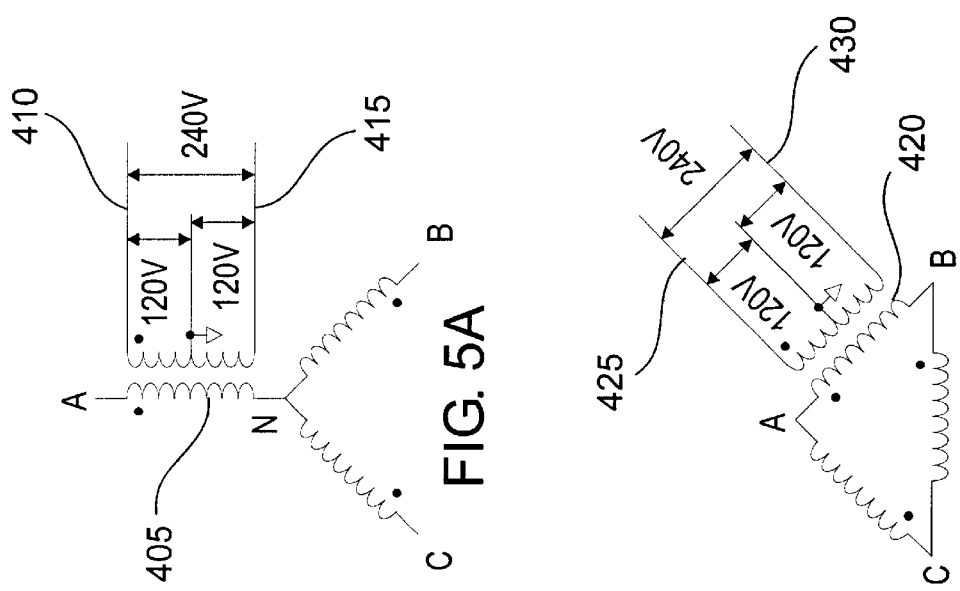
FIG. 5C
FIG. 5A
FIG. 5B

APPARATUS AND METHOD FOR IDENTIFYING CABLE PHASE IN A THREE-PHASE POWER DISTRIBUTION NETWORK

RELATED INVENTION

The present invention claims priority under 35 U.S.C. §119(e) to: "Apparatus and Method for Identifying Cable Phase in a 3-Phase Power Distribution Network," Provisional U.S. Patent Application Ser. No. 60/363,076, filed Mar. 11, 2002, which is incorporated by reference herein.

TECHNICAL FIELD OF THE INVENTION

The present invention relates to the field of three-phase power distribution networks. More specifically, the present invention relates to the field of identifying the phase of a cable in a three-phase power distribution network.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage (345,000 volts phase-to-phase) is delivered to multiple transmission substations at which transformers step this high voltage down to a lower three-phase voltage (69,000 volts phase-to-phase). This 69,000-volt three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120 and 240 volts for delivery to the commercial and residential customers.

Ideally, the utilities try to initially design the feeder circuits such that the current loads on each single-phase output of the three-phase transformer are equal. However, over time as new customers are added, one of the phases may become more heavily loaded than the others. To re-balance the loading, some of the branch circuits are moved from the more heavily loaded phase to the more lightly loaded phases.

To re-balance the loading, the phase of each cable in a distribution cabinet must be accurately known. Otherwise, a cable may be erroneously removed from a more lightly loaded phase and placed on the more heavily loaded phase. If this happens, the procedure will have to be repeated again, which will cause a second disruption in service to all customers on the branch being re-phased. In the worst case, adding a greater load to the more heavily loaded phase may cause the substation fuse to blow on that phase, resulting in a large power outage for all customers on the more heavily loaded phase.

Currently, to accurately identify the phase of a particular feeder branch, utility company personnel must physically trace a cable run back through various distribution cabinets until they reach a point in the distribution network at which the phase is definitely known. This can be a very time consuming process.

Various devices and methods have been described to assist in the phase identification of cables. Bouvrette, U.S. Pat. No. 4,626,622, proposes using modems and telephone lines to transmit a signal associated with the phase, at a point on the cable in which it is known, to another point on the cable in which it is unknown. Pomatto, U.S. Pat. No. 5,510,700, proposes essentially the same thing only using radio signals. However, both these techniques require calibration procedures and special training to be used effectively.

Accordingly, it is the object of the present invention to provide a new and improved method, of identifying the phase of a cable that is easy to use and does not require any calibration procedures or special training on the part of the user.

SUMMARY OF THE INVENTION

Briefly, to achieve the desired object of the present invention, Global Positioning System (GPS) receivers are used at both the known and unknown phase locations in the power distribution network to time-correlate phase information, thereby identifying the phase of the cable in question.

Specifically, using the 1 pps (one pulse per second) GPS signal, phase information for the known phase will be recorded at each GPS second and entered into a computer. A worker at the unknown phase location will simultaneously also record the cable phase information at a particular 1 pps GPS second on a phase identification meter that will convert the recorded time and phase to a short alpha or numeric sequence. The worker will then give that sequence to the dispatcher. The dispatcher will determine the phase by entering the sequence received from the worker into the computer. The dispatcher will then relay the cable phase designation back to the worker.

In this way, the worker determines the cable phase by taking a simple meter measurement in much the same way voltage and current measurements are taken. Therefore, no special procedures or training is required on the part of the worker.

BRIEF DESCRIPTION OF THE DRAWINGS

FIG. 2 illustrates voltage phase relationships in a three-phase power network.

FIG. 3 illustrates the equivalent circuit of a transformer and the phase shift through it.

FIG. 5 illustrates secondary voltage phase relationships in a three-phase power network. FIG. 5A illustrates a wye-connected transformer and FIG. 5B illustrates a delta-connected transformer. FIG. 5C is a vector diagram of the secondary output voltage phases in wye-connected and delta-connected transformers.

DETAILED DESCRIPTION OF THE PREFERRED EMBODIMENTS

The goal of the present invention is to provide the utility worker with an easy to use phase identification apparatus and method for identifying the phase of a cable in a three-phase power distribution network.

Figure 1:
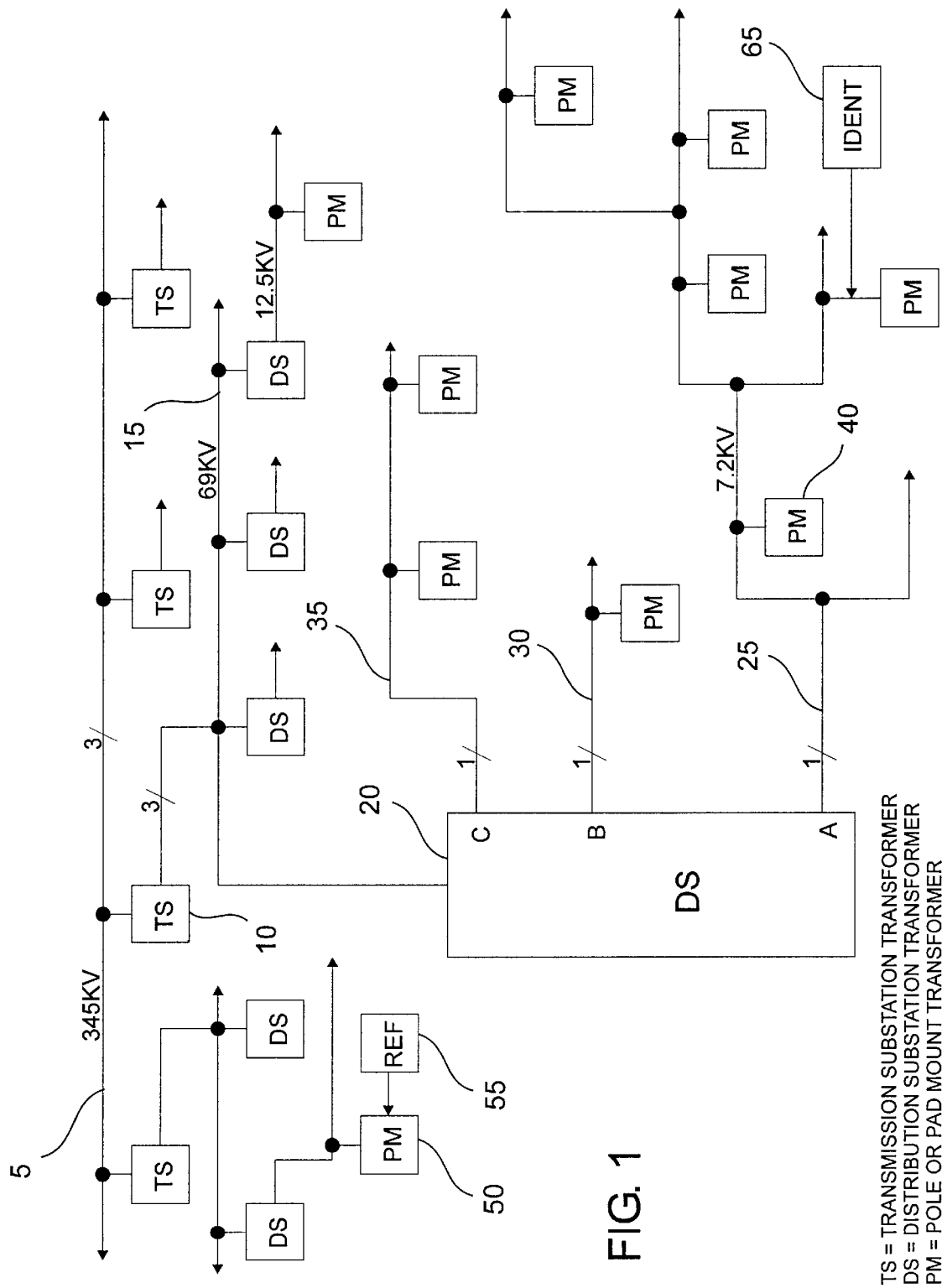
FIG. 1 is an illustration of a typical power distribution network.

FIG. 1 illustrates a typical power distribution network in which three-phase power cables 5 at 345 kilovolts feed a series of transmission substation (TS) transformers 10 spread out over a large geographical area. The 69-kilovolt outputs 15 of TS transformers 10 are connected to a series of distribution substation (DS) transformers 20 situated over a smaller geographical area. The 7.2-kilovolt phase-to-ground (12.5-kilovolt phase-to-phase) phase-A feeder output 25 of a DS transformer 20 powers a local distribution network, which contains a number of pole-mounted or pad-mounted (PM) transformers 40 that are used to provide the final 120/240-volt power to the commercial or residential customers. In the same manner, phase-B feeder output 30 of transformer 20 powers another local distribution network, while phase-C feeder output 35 powers a third local network.

At some location in the power distribution network, a PM transformer 50 is used to provide a low-voltage input reference of phase A, B, or C to a permanently attached reference phase identification meter 55 (hereinafter reference meter 55). This reference meter 55 most likely will be situated in the dispatch facility. The purpose of the reference meter 55 is to provide a reference of phase A, B, or C that can be used to determine the unknown phase of a cable at any other location in the network. A worker at a remote location uses another phase identification meter 65 (hereinafter test meter 65) to momentarily probe the voltage on the cable whose phase is to be determined.

Figure 2A:
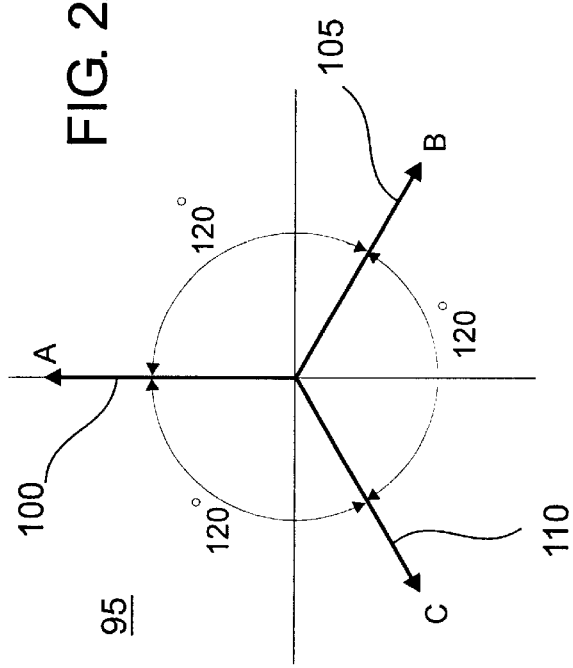
FIG. 2A illustrates the phase relationships as a phasor diagram.

FIG. 2A illustrates the phase relationship between phases A, B, and C in a three-phase power distribution network. Phasor diagram 95 represents phase A as vector 100 at zero degrees, phase B as vector 105 at 120 degrees, and phase C as vector 110 at 240 degrees. In a 60 Hz power network, the entire phase diagram rotates at a rate of 60 revolutions per second but the phase difference between phases A, B, and C remains constant. Each revolution of the phase diagram represents 360 degrees of phase rotation by the voltage vectors.

Because phase is rotational, each phase may be said to both lead and lag each other phase. That is, depending upon the point of references, phase A leads phase B and phase B lags phase A. For the complete diagram: phase A leads phase B, phase B leads phase C, and phase C leads phase A by 120 degrees; phase A leads phase C, phase B leads phase A, and phase C leads phase B by 240 degrees; phase A lags phase C, phase B lags phase A, and phase C lags phase B by 120 degrees; and phase A lags phase B, phase B lags phase C, and phase C lags phase A by 240 degrees.

Figure 2B:
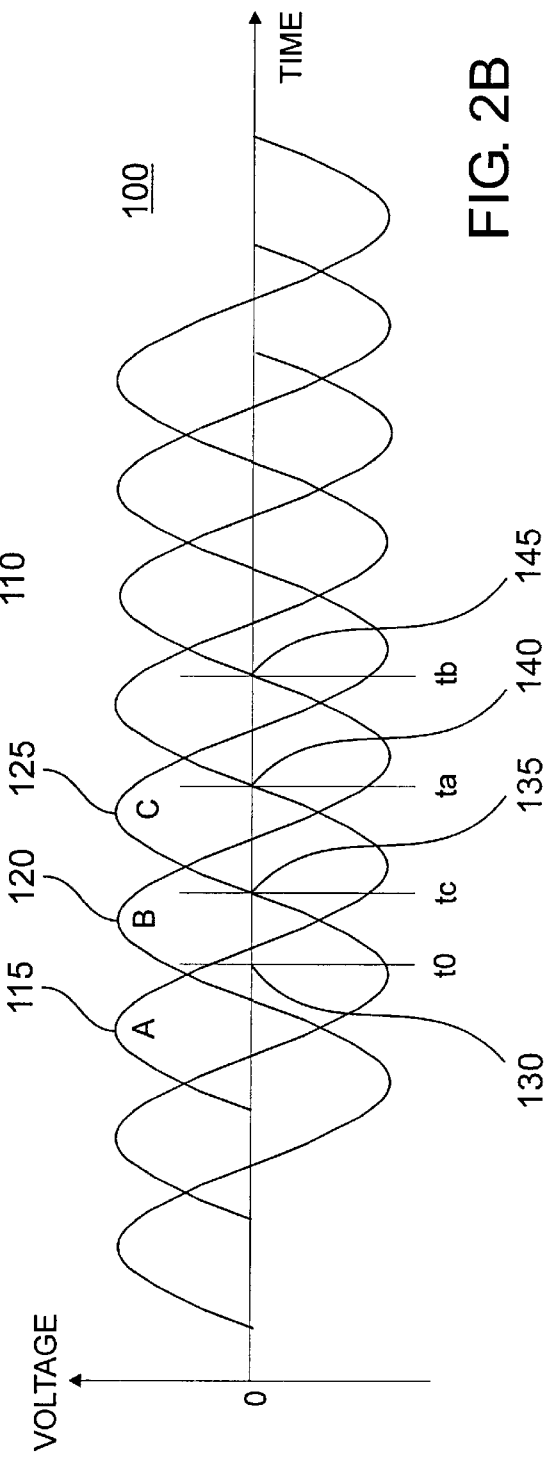
FIG. 2B illustrates the phase relationships as a voltage-time diagram.

FIG. 2B illustrates the same phase relationship in a voltage waveform versus time diagram 100. To complete a single 360-degree cycle of phase rotation, the voltage of each phase starts at zero volts, peaks in the positive direction, returns to zero volts, peaks in the negative direction, and again returns to zero volts. Phase A, B, and C are represented by voltage waveforms 115, 120, and 125 respectively.

For power at 60 Hz, each cycle takes 16.67 milliseconds to complete a 360-degree cycle. This is equivalent to 46.3 microseconds per degree or 5.55 milliseconds for 120 degrees. Therefore, phases A, B, and C are separated in time by 5.55 milliseconds.

Since the frequency of 60 Hz power distribution networks is so low, there is very little voltage phase shift between two points on the same phase anywhere in the network. That is, if one were to observe the voltage waveforms of phase A at widely separated points in the network, all voltages would pass through a predetermined voltage in a predetermined direction at substantially the same time. In the preferred embodiment, the predetermined voltage is zero volts and the predetermined direction is rising, i.e., from negative to positive. That is, all voltages would rise though zero volts at substantially the same time.

In the present invention, the phase of the voltage waveforms at two widely separated points in the power distribution network are observed and compared at substantially the same instant (i.e., the instantaneous phase) using time signals from the Global Positioning System (GPS). The GPS allows all users to have precision time correlation so that a voltage sample can be taken at different locations at substantially the same time. The time marks in FIG. 2B illustrate the method by which the unknown phase on the cable under test can be determined.

Those skilled in the art will appreciate that the phrase "instantaneous phase" is taken to mean the phase of each sample synchronized to substantially the same instant. The absolute time require to take each sample is irrelevant to this discussion. It will also be appreciated that a determination of phase may be performed in any of numerous ways well known to those skilled in the art, including, but not limited to, the time duration methodology discussed herein.

In FIG. 2B, assume that at some instant of GPS time a timer is started at time t0 130. At the reference phase site (assumed here to be connected to phase A), the timer is stopped when phase A voltage rises through zero volts. This represents a time interval ta 140 since time t0. Since the time difference between phases is 5.55 milliseconds, time interval tb 145 of phase B and time interval tc 135 of phase C can be calculated directly without having to actually measure the voltage on phases B and C.

At the point of unknown phase, a similar timer is also started at time t0 130 as determined by GPS time. The timer is stopped when the cable voltage rises through zero volts. This represents a time interval tx. The time interval tx will be very close to one of the time intervals ta, tb, or tc, depending on whether the cable is phase A, B, or C, respectively. Therefore, the unknown phase of the cable under test may be determined simply by comparing the time interval of the test meter 65 to that of the reference meter 55. This method is vastly superior to the prior art mentioned earlier because transmission of a real-time reference signal from the reference site to the remote site is not required.

Since the GPS allows the measurements to be taken and recorded at both locations at substantially the same time, the required reference information can be obtained and recorded by the reference meter and retrieved at any convenient time and in any convenient manner. A worker could gather information at multiple remote sites so as to later determine the phase of a number of cables. This information may be obtained and recorded in the field, then compared with stored reference information upon return to the shop. As long as the reference meter recorded reference information at times that matched at least one of the times recorded by the worker for each cable, the unknown phases could be determined.

For in-field determination of the cable phase, the worker could call the dispatcher and relay the information obtained by the test meter. This information would contain the start time t0 and the time interval tx for the test cable. The dispatcher would enter this information into the reference meter, a computer, or other instrument. The information would be compared to the stored reference information for the same start time t0, and the unknown phase determined. The dispatcher would then relay this phase information to the worker.

GPS receivers typically output a time mark at 1-second intervals. These time marks are locked to GPS time in seconds. This provides convenient time frames for the reference meter to take and record reference phase information. The test meter used by the worker would also collect data at the same 1-second time mark as determined by its GPS receiver. The dispatcher's computer or other instrument would search back through the recorded reference-meter data to find the data collected at the same GPS second as the test meter to determine the unknown phase.

Note that since phases A, B, and C are separated by 120 degrees, it is not necessary to measure phase precisely to identify the unknown phase. If the unknown phase is within plus or minus 59 degrees of one of the reference phases, the unknown phase will be accurately determined. If 60 Hz power propagated through the cable at the speed of light (the actual propagation velocity is slightly less), it would require approximately 8.6 miles of cable to obtain 1 degree of phase shift. Therefore, based upon propagation phase shifts, a service radius around the reference meter of up to 120 miles is attainable. Assuming a 10-degree error budget for propagation velocity, the service radius is at least 80 miles.

A time uncertainty of 100 nanoseconds represents approximately 0.002 degrees of phase shift at 60 Hz. GPS receivers determine time much more accurate than 100 nanoseconds so GPS time uncertainty is simply not an issue in this application. Another potential source of voltage phase shift in the network (other than from power factor correction circuits) is the voltage phase shift that can occur in transformers. FIG. 3 illustrates their potential phase shift.

Figure 3A:
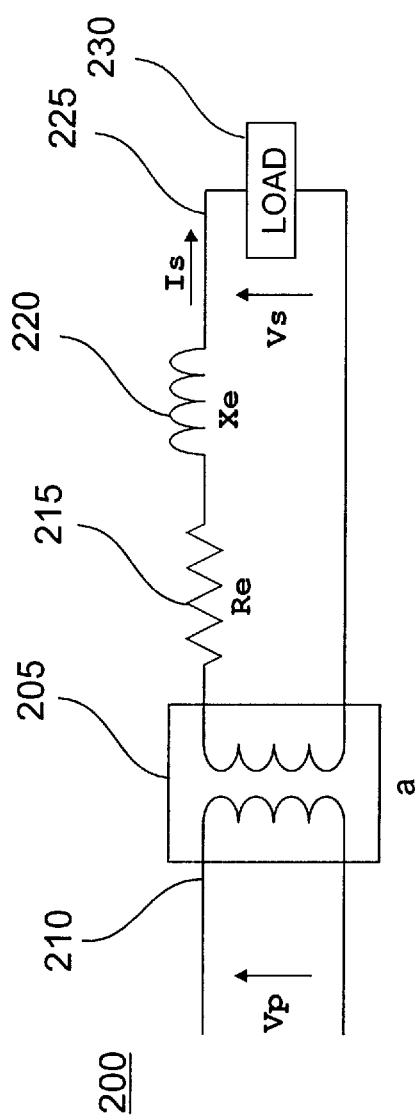
FIG. 3A illustrates the equivalent circuit of a transformer referred to the secondary.

FIG. 3A represents the equivalent circuit 200 of a transformer. In this representation, the primary voltage Vp at the input terminal 210 produces secondary voltage Vs at the output terminal 225. A loss-free transformer 205 reduces the primary voltage Vp by the factor "a" based on the primary to secondary turns ratio. All transformer losses, referred to the secondary here, further reduce voltage Vs and cause its phase to be shifted with respect to Vp. The voltage drop due to transformer resistance Re is represented by current passing through resister 215. The voltage drop due to transformer reactance Xe is represented by current passing through inductor 220.

Figure 3B:
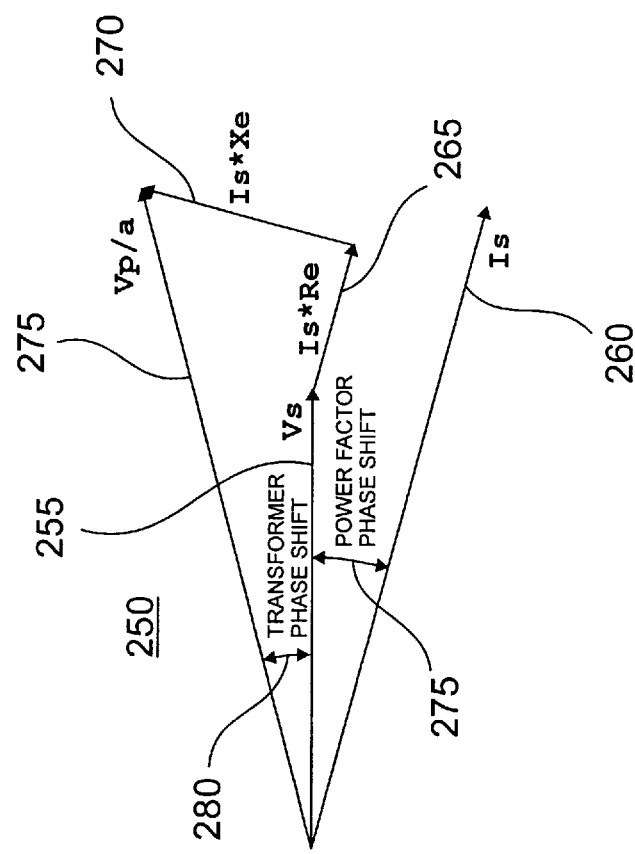
FIG. 3B illustrates a phasor diagram associated with the equivalent circuit.

In FIG. 3B, the greatly exaggerated phasor diagram 250 illustrates how phase shift through a transformer occurs. When a lagging power factor load 230 is placed on the output of the transformer, secondary current Is, represented by vector 260, flows out of phase with the secondary voltage Vs, represented by vector 255 as is well known by those skilled in the art. The power factor phase shift 275 is determined by the power factor of the load 230.

The voltage drop due to Re is in phase with secondary current Is and is represented by vector 265. The voltage drop due to Xe is 90 degrees out of phase with secondary current Is and is represented by vector 270. The vector addition of these voltage drops to secondary voltage Vs equals the loss-free turns ratio voltage Vp/a represented by vector 275. Since no phase shift occurs through loss-free transformer 205, transformer phase shift 280 represents the voltage phase shift due to the transformer.

The phase shift through a transformer depends on the magnitude and power factor of the load current. However, in modern power distribution transformers, power losses are only a few percent so the resistive and reactive voltage drops are very small compared to their primary and secondary voltages. Therefore, voltage phase shift through the transformer is typically less than plus or minus 5 degrees.

The total voltage phase-error budget is plus or minus 59 degrees. The phase uncertainties due to propagation and GPS time tagging are less than plus or minus 10 degrees as was explained earlier. Therefore, nearly plus or minus 50 degrees of transformer phase shift can be tolerated before the accuracy of identifying the unknown phase is compromised. This large allowable phase uncertainty allows the reference meter and test meter to be separated by many transformers. That is, phase A in the network is essentially the same everywhere in the network, so the reference meter can be placed almost anywhere, including on the dispatcher's desk and plugged into his wall socket. The wall socket does not even have to be phase A. As long as the reference meter knows which phase the reference phase is, the phase identification method that was described here will work.

Figure 4:
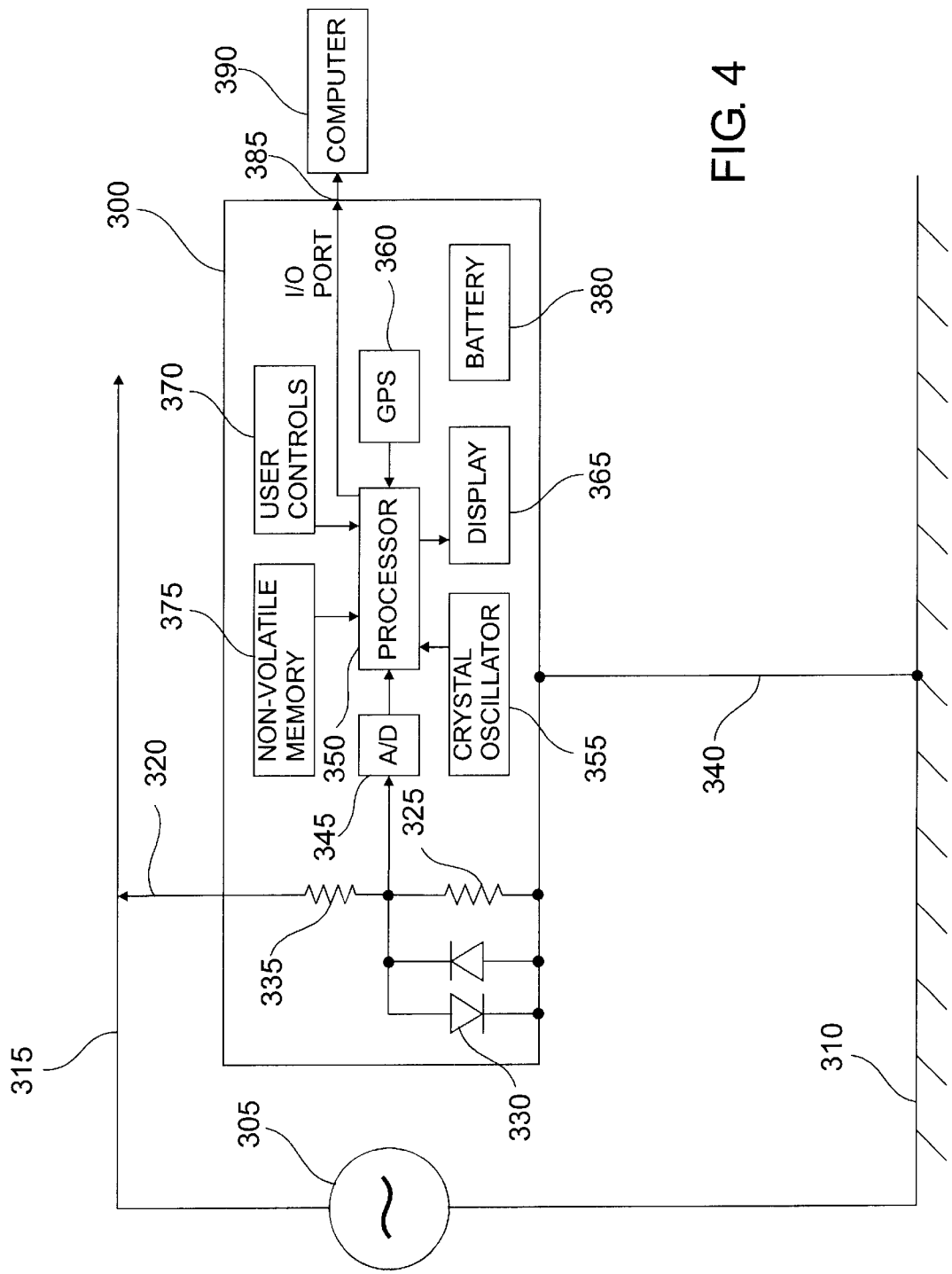
FIG. 4 illustrates a conceptual block diagram of a phase identification meter.

A descriptive block diagram of the worker's phase identification meter (the test meter) is illustrated in FIG. 4. The test meter 300 may be attached to the end of a hot stick and the meter's voltage probe 320 placed against a power line 315. The power line is modeled as an AC voltage with respect to ground by voltage source 305 and ground 310. The test meter is connected to ground through grounding wire 340.

A voltage reducer between the power line and ground is used. The voltage reducer may be formed of a voltage divider having a high value (on the order of 10 million ohms) power line resistor 335 in series with a low value (on the order of 1000 ohms) probe resistor 325. The high-value resistor 335 connects to the power line and the low-value resistor 325 connects to ground to step down the high-voltage power-line voltage. Using a sensitive analog to digital (A/D) converter 345, only a few millivolts of power-line voltage needs to be developed across probe resistor 325. Back to back voltage-clamping diodes 330 protect A/D converter 345 from damage due to any over voltages.

The heart of test meter 300 is processor 350. The processor contains an internal interval timer, a memory, and computing resources. A/D converter 345 converts power line voltage into a digital signal. The 1 pps GPS signal is received by a GPS receiver 360 and commands the processor 350 to start its internal interval timer. The negative to positive transition of the power line voltage, as measured by A/D converter 345, commands the processor to stop the interval timer and record the time interval along with the GPS time that initiated the timer.

A measurement algorithm will be programmed into the processor to ensure that only good measurement data is recorded and displayed. For example, after the operator presses a "take measurement button," the test meter may wait until the amplitude of the power-line voltage across probe resistor 325 reaches a predetermined value. It will then take measurements at more than one GPS second and confirm that successive measurements produce similar timer counts (time intervals) based on the frequency of the power-line voltage. At 60 Hz, exactly 60 cycles occur each GPS second so that all timer intervals should be identical. However, in a typical power distribution network, the power line frequency may randomly vary from exactly 60 Hz by a small amount (usually a few tenths of a percent or less). As long as successive timer intervals are within the assumed tolerance, a measurement will be recorded and displayed, along with an indication to the worker that the measurement is completed.

To guard against loss of the 1 pps GPS signal, a crystal oscillator 355 will be locked to GPS time. This allows the test meter to be used inside cabinets or in other areas which block reception of the GPS signal. Typical crystal oscillators have a short-term accuracy on the order of 1 part per million (ppm). Since the phase of a 60 Hz power line voltage rotates 1 degree per 46.3 microseconds, it takes 46.3 seconds for a clock that is in error by 1 ppm to accumulate 1 degree of phase uncertainty. For a 10-degree error budget, the GPS receiver could lose lock for 7.7 minutes. Therefore, once GPS lock is obtained in a clear area, the test meter can be moved to a shielded area to obtain the phase measurement.

Other resources contained in the test meter 300 are display 365, user controls 370, non-volatile memory 375, battery 380, and input-output port 385. The crystal oscillator 355 provides the processor with an accurate clock frequency so as to maintain the 1 pps timing during periods of GPS signal outages. Display 365 will be a typical LCD meter display to display the phase information to the worker. User controls 370 include the on-off switch and any other buttons required to activate various features built into the test meter. Battery 380 allows the test meter to operate on battery power. Non-volatile memory 375 allows measurement data to be retained after the test meter is turned off. Input-output port 385 allows measurement information to be downloaded to a computer 390.

It is anticipated that a mode will be offered in which GPS time is designated in terms of the number of seconds since the last GPS hour. That is, the number would range from 1 second to 3600 seconds. Also, the interval timer count could be quantified to increments of 1 degree. That is, the time duration between a GPS second and the first power line voltage negative to positive zero crossing would range between 1 and 360 degrees.

To make the phase identification sequence (the gathered phase information) as short as possible, a single sequence could be used in which a number between 1 and 360 represents the time duration collected during the first GPS second. A number between 361 and 720 represents the time duration collected during the second GPS second and so on. The largest possible number would be equal to 3600 times 360. This number in turn could be converted to letters in which "A" represents "1", "B" represents "2", "Z" represents "26", "AA" represents "27", and so on. In this way, the largest number could be represented using only five letters.

Reducing the phase identification sequence to only five letters minimizes the time it takes the worker to verbally communicate the sequence to the dispatcher and minimizes the time it takes the dispatcher to enter the sequence into the reference meter or computer. It also increases accuracy in that the phonetic alphabet can be used with letters. For example, the sequence "MHE" would be communicated as "mike, hotel, echo."

The permanently attached reference meter will operate in essentially the same manner as the test meter. One difference is in the voltage probe 320. The reference meter will likely be "hard wired" to the reference phase voltage, most likely through a normal 120-volt wall socket. Most likely, the voltage reducer will be a simple wall socket step-down transformer coupled between the power line and neutral (ground), instead of the resistor divider circuit (335 and 325) used in the test meter 300.

The reference meter may also have more computing power and a larger memory for storing phase measurements. It may also contain a keyboard to enter the phase identification sequence obtained from the worker at the unknown phase location. Conversely, the reference meter may simply transfer all measurement data to one or more computers in real time. If so, a software program running on the host computer would handle all measurement storage and phase identification functions.

In a large metropolitan area, multiple reference phase instruments might be used at various locations for redundancy and reliability cross checking. Also, if it is found that a significant phase shift occurs in certain branches due to power-factor correction circuits or other causes, that information can be entered into the reference meter database. To take those phase shifts into account, the dispatcher would have to enter information identifying the branch circuit of the unknown phase measurement along with the unknown phase sequence. The computer would then remove the known phase offset in making the determination of the unknown phase.

Relative phase measurements taken on the phase A, B, or C primary voltages will always be close to one of three reference phase angles which are separated by 120 degrees. However, relative phase measurements taken on secondary voltages can be separated by only 30 degrees as is illustrated in FIG. 5. Vector diagram 400 represents the 12 different secondary phases that can be obtained on wye and delta connected transformers.

The most common transformer connection in distribution networks is the four-wire wye arrangement in which three-phase power is transported using a wire for each of the three phases plus a fourth grounded neutral wire. In a wye arrangement, the primary side of each single-phase PM transformer is connected across one of the three primary phases and neutral. A grounded center tap secondary winding supplies the commercial or residential customer 120 and 240 volts in which one of the 120-volt circuits is in phase with the primary winding phase and the other 120-volt circuit is 180 degrees out of phase with the primary winding phase.

FIG. 5A illustrates the wye-connected transformer in which the primary winding 405 is connected to phase A and the secondary winding output 410 is in phase with the primary winding voltage and the secondary winding output 415 is out of phase with the primary winding voltage. In FIG. 5C, the primary phase angle is represented by vector 435 while the in phase secondary output 410 is represented by vector 440 and the out of phase output 415 by vector 445. Therefore, when the phase identification meter is applied to secondary voltages derived from wye connected transformers on phase A, the measured phase will be either 0 or 180 degrees. In a similar manner, secondary voltages derived from wye-connected transformers on phase B will indicate a phase angle of either 120 or 300 degrees while wye-connected transformers on phase C will indicate a phase angle of either 240 or 60 degrees.

Three-phase power can also be distributed in a three-wire delta arrangement in which a wire is used for each of the three phases. The primary side of each single-phase PM transformer is then connected across two of the three primary phases. A grounded center tap secondary winding supplies the commercial or residential customer 120 and 240 volts in which one of the 120 volt circuits is in phase with the primary winding phase and the other 120 volt circuit is 180 degrees out of phase with the primary winding phase.

FIG. 5B illustrates a delta-connected transformer in which the primary winding 420 is connected across primary phases A and B. The secondary winding output 425 is in phase with the primary winding phase and secondary winding output 430 is out of phase with the primary winding phase. In FIG. 5C, the primary winding phase angle is represented by vector 450 which is a vector from the voltage on the primary winding terminal connected to phase A to the voltage on the primary winding terminal connected to phase B. The in phase secondary output 425 is represented by vector 455 and the out of phase output 430 by vector 460. Therefore, when the phase identification meter is applied to secondary voltages derived from a delta-connected transformer connected across phases A and B, the measured phase will be either 150 or 330 degrees. In a similar manner, secondary voltages derived from a delta connected transformer across phases B and C will indicate a phase angle of either 270 or 90 degrees while a delta connected transformer across phases C and A will indicate a phase angle of either 30 or 210 degrees.

Using the phase identification meter on secondary voltages reduces the total phase error budget from plus and minus 59 degrees to plus and minus 14 degrees. However, phase measurement tests made at widely separated points on an actual power distribution network indicate that actual phase errors are much less than 14 degrees (they were actually less than 5 degrees). Identifying cable phase by measuring secondary voltages is preferable by utilities to measuring primary voltages because it can be performed by personnel that are not high-voltage certified. An accessory attachment may be supplied with the phase identification meter to allow it to be simply plugged into any commercial or residential wall socket to determine which primary phase powers the facility.

Although the preferred embodiments of the invention have been illustrated and described in detail, it will be readily apparent to those skilled in the art that various modifications may be made therein without departing from the spirit of the invention. This is especially true in the area of user features.

For example, to speed up measurements on a series of overhead lines, multiple measurements may be automatically stored in the test meter. Each new measurement would be initiated upon detection of new power line voltage that occurs a few seconds after the previous power line voltage terminates. This feature would allow the worker to measure the phase on a number of high overhead lines without having to retrieve the test meter after each measurement.

It is also possible to capacitively couple the test meter probe to the power line, instead of actually touching bare wire, if the actual or estimated phase shift is accounted for. This feature would allow the test meter to be used on insulated cables.

To limit maximum propagation phase error, the test and reference meters could be programmed to only operate inside a designated service area. Location coordinates from the GPS receiver could be compared to a map programmed into the processor of each meter to determine if the meter was inside the service area.

Many different ways of communicating the test meter phase identification sequence (the gathered phase information) to the reference meter or computer are possible. The sequence could be called in using a utility radio, a cell phone, or a landline phone. A modem or computer could be used to send or E-mail the sequence. The sequence could be simply written down and delivered by courier, mail, or personally by the worker.

Alternatively, one or more reference meter phase identification sequences could be delivered to the test location and the unknown cable phase determined using either the test meter or a computer. Again, many different ways of communicating the reference meter sequences to the test meter or computer are possible. The test location computer could query the reference location computer for the required phase identification sequence or it could automatically receive and store all new sequences as they became available. A collection of the most current (last minute) reference sequences could be continuously broadcast to a receiver within the test meter and the unknown cable phase determined automatically using the test meter. The broadcast could be via FM subcarrier on a local FM station or satellite.

Also, the described apparatus and method will work equally well at other power-line frequencies and in other polyphase networks such as 50 Hz networks or 2-phase networks.

What is claimed is:

1. An apparatus for identifying a cable phase in a three-phase power distribution network, wherein:
   said three-phase power distribution network comprises:
      a first phase;
      a second phase lagging said first phase by 120 degrees; and
      a third phase lagging said first phase by 240 degrees; and
   said apparatus comprises:
      a first phase identification meter coupled to a first cable at a first location in said network and configured to gather phase data relative to said first cable at a predetermined Global Positioning System (GPS) time, wherein said phase data relative to said first cable comprises a first interval;
      a second phase identification meter coupled to a second cable at a second location in said network and configured to gather phase data relative to said second cable at said predetermined GPS time, said phase data relative to said second cable comprises a second interval; and
      a computer configured to receive said phase data from each of said first and second phase identification meters and to identify said cable phase in response to said data, wherein:
         a difference of said first and second intervals corresponds to an angular displacement; and
         said phase of said first cable lags said first phase by 0 degrees.

2. An apparatus as claimed in claim 1 wherein said first phase identification meter comprises:
   a processor configured to gather said phase data;
   a GPS receiver coupled to said processor and configured to cause said processor to start gathering said phase data; and
   an analog to digital (A/D) converter coupled between said first cable and said processor, and configured to cause said processor to stop gathering said phase data.

3. An apparatus as claimed in claim 2 wherein:
   said CPS receiver is configured to cause said processor to start gathering said phase data at a start time, said start time being said predetermined GPS time;
   said A/D converter is configured to cause said processor to stop gathering said phase data at a stop time, said stop time being when a voltage on said first cable crosses zero in a predetermined direction; and
   said phase data comprises:
      said start time; and
      a time interval between said start time and said stop time.

4. An apparatus as claimed in claim 1 wherein:
   a first one of said first and second phase identification meters is a reference meter;

a second one of said first and second phase identification meters is a test meter;

said reference meter is coupled to one of said first and second cables having a known phase;

said test meter is coupled to one of said first and second cables having an unknown phase, said cable being the cable whose phase is to be identified by said apparatus; and said computer is configured to identify said cable phase by comparing said phase data for said unknown phase to said phase data for said reference phase.

5. An apparatus as claimed in claim 1 wherein said first location is within 120 miles of said second location.

6. An apparatus as claimed in claim 5 wherein:

an error budget of 10 degrees is used; and said first location is within 80 miles of said second location.

7. An apparatus as claimed in claim 1 wherein said first phase identification meter comprises:

an analog to digital (A/D) converter coupled to said first cable;

a processor coupled to and configured to control said A/D converter;

a timer coupled to said processor and configured to control and to be controlled by said A/D converter through said processor; and a GPS receiver coupled to said processor and configured to control said timer through said processor.

8. An apparatus as claimed in claim 7 wherein said OPS receiver is configured to synchronize said timer to a OPS time signal.

9. An apparatus as claimed in claim 8 wherein:

said GPS receiver is configured to establish a start time for said A/D converter when said GPS receiver is receiving said GPS time signal; and said first phase identification meter additionally comprises a crystal oscillator configured to track said GPS time signal and establish said start time when said GPS receiver is not receiving said GPS time signal.

10. An apparatus as claimed in claim 1 wherein said first phase identification meter comprises:

a processor configured to generate a timing event;

a GPS receiver coupled to said processor and configured to establish a start time for said timing event, said start time being said predetermined OPS time; and an A/D converter coupled to said first cable and to said processor, said A/D converter being configured to sample a voltage on said first cable during said timing event and to terminate said timing event when said voltage crosses zero in a predetermined direction.

11. An apparatus as claimed in claim 1 wherein:

said second location is on a secondary of a single-phase transformer coupled to one leg of a wye-connected transformer;

a phase of said one leg is said first phase when said angular displacement is one of 0 degrees and 180 degrees;

a phase of said one leg is said second phase when said angular displacement is one of 120 degrees and 300 degrees; and a phase of said one leg is said third phase when said angular displacement is one of 240 degrees and 60 degrees.

12. An apparatus as claimed in claim 1 wherein:

said second location is on a secondary of a single-phase transformer coupled to one leg of a delta-connected transformer;

said one leg is coupled between said first and second phases when said angular displacement is one of 150 degrees and 330 degrees;

said one leg is coupled between said second and third phases when said angular displacement is one of 270 degrees and 90 degrees; and said one leg is coupled between said third and first phases when said angular displacement is one of 30 degrees and 210 degrees.

13. An apparatus for identifying a cable phase in a three-phase power distribution network wherein:

said three-phase power distribution network comprises:

a first phase;

a second phase lagging said first phase by 120 degrees; and a third phase lagging said second phase by 120 degrees; and said apparatus comprises:

a first phase identification meter coupled to a first cable at a first location in said network and configured to gather phase data relative to said first cable at a predetermined Global Positioning System (GPS) time, wherein said phase data relative to said first cable comprises a first time interval;

said apparatus additionally comprises a second phase identification meter coupled to a second cable at a second location in said network and configured to gather phase data relative to said second cable at said predetermined GPS time, wherein said phase data relative to said second cable comprises a second time interval; and a computer configured to receive said phase data from each of said first and second phase identification meters and to identify said cable phase in response to said data wherein:

said first cable is at said first phase;

said second cable is at said first phase when said second time interval is substantially equal to said first time interval;

said second cable is at said second phase when said second interval is one of longer than said first interval by substantially 120 degrees and shorter than said first interval by substantially 240 degrees; and said second cable is at said third phase when said second interval is one of longer than said first interval by substantially 240 degrees and shorter than said first interval by substantially 120 degrees.

14. A method for identifying a phase of a cable in a three-phase power distribution network, said method comprising:

connecting a first phase identification meter to a first cable at a first point in said power distribution network;

connecting a second phase identification meter to a second cable at a second point in said power distribution network;

synchronizing said first and second phase identification meters so a start time is substantially identical for each of said first and second phase identification meters;

measuring, with said first phase identification meter, a first interval between said start time and a first stop time when a voltage on said first cable passes through a predetermined voltage in a predetermined direction;

measuring, with said second phase identification meter, a second interval between said start time and a second stop time when a voltage on said second cable passes through said predetermined voltage in said predetermined direction; and computing said phase of said second cable in response to said first and second intervals, wherein said computing activity comprises:

establishing as an unknown phase that phase of said three-phase power distribution network present on said second cable;

establishing as a reference phase that phase of said three-phase power distribution network present on said first cable;

establishing as a trailing phase that phase of said three-phase power distribution network that lags said reference phase by 120 degrees;

establishing as a leading phase that phase of said three-phase power distribution network that leads said reference phase by 120 degrees;

determining said unknown phase to be said reference phase when said second interval is substantially equal to said first interval;

determining said unknown phase to be said trailing phase when said second interval is longer than said first to interval by substantially 120 degrees;

determining said unknown phase to be said trailing phase when said second interval is shorter than said first interval by substantially 240 degrees;

determining said unknown phase to be said leading phase when said second interval is longer than said first interval by substantially 240 degrees; and determining said unknown phase to be said leading phase when said second interval is shorter than said first interval by substantially 120 degrees.

15. A method as claimed in claim 14 wherein said synchronizing activity synchronizes said first and second phase identification meters via a satellite-derived time signal.

16. A method as claimed in claim 15 wherein said synchronizing activity synchronizes said first and second phase identification meters via a time signal of the Global Positioning System.

17. A method as claimed in claim 14 wherein said predetermined voltage is zero.

18. A method for identifying a phase of a cable in a three-phase power distribution network, said method comprising:

connecting a first phase identification meter to a first cable at a first point in said power distribution network;

connecting a second phase identification meter to a second cable at a second point in said power distribution network;

synchronizing said first and second phase identification meters so a start time is substantially identical for each of said first and second phase identification meters;

measuring, with said first phase identification meter, a first interval between said start time and a first stop time when a voltage on said first cable passes through a predetermined voltage in a predetermined direction, wherein said measuring activity comprises:

storing said interval data within said first phase identification meter; and outputting said interval data upon demand;

measuring, with said second phase identification meter, a second interval between said start time and a second stop time when a voltage on said second cable passes through said predetermined voltage in said predetermined direction; and computing said phase of said second cable in response to said first and second intervals.

19. A method as claimed in claim 18 wherein said measuring activity with said first phase identification meter comprises:

determining said start time in response to a time-signal receiver;

commencing a timing event at said start time;

monitoring said voltage of said cable during said timing event;

determining when said voltage passes through said predetermined voltage in said predetermined direction; and establishing said first interval as a duration of said timing event.

20. A method as claimed in claim 18 wherein said measuring activity with said first phase identification meter additionally comprises:

encoding said start time and said first interval as interval data; and outputting said interval data.

21. A method as claimed in claim 18 additionally comprising:

communicating said first interval from said first phase identification meter to a computer prior to said computing activity; and communicating said second interval from said second phase identification meter to said computer prior to said computing activity.

22. A method as claimed in claim 18 wherein said predetermined voltage is zero.

23. A method for identifying a phase of a cable in a three-phase power distribution network, said method comprising:

mapping a service area;

storing said map within one of said first and second phase identification meters;

connecting a first phase identification meter to a first cable at a first point in said power distribution network;

connecting a second phase identification meter to a second cable at a second point in said power distribution network; determining if said second point in said power distribution network is within said service area;

synchronizing said first and second phase identification meters so a start time is substantially identical for each of said first and second phase identification meters;

measuring, with said first phase identification meter, a first interval between said start time and a first stop time when a voltage on said first cable passes through a predetermined voltage in a predetermined direction;

measuring, with said second phase identification meter, a second interval between said start time and a second stop time when a voltage on said second cable passes through said predetermined voltage in said predetermined direction; and computing said phase of said second cable in response to said first and second intervals.

\* \* \* \* \*

UNITED STATES PATENT AND TRADEMARK OFFICE
CERTIFICATE OF CORRECTION

PATENT NO. : 6,667,610 B2 Page 1 of 1
DATED : December 23, 2003
INVENTOR(S) : Gregory Hubert Piesinger It is certified that error appears in the above-identified patent and that said Letters Patent is hereby corrected as shown below:

Column 10,
Line 53, "CPS" should read -- GPS --.

Column 11,
Lines 31, 32 and 48, "OPS" should read -- GPS --.

Signed and Sealed this

Tenth Day of August, 2004

JON W. DUDAS
*Acting Director of the United States Patent and Trademark Office*